United States Patent [19]

Hirose et al.

[11] Patent Number: 5,689,676

[45] Date of Patent: Nov. 18, 1997

[54] SEQUENTIAL EEPROM WRITING APPARATUS WHICH SEQUENTIALLY AND REPETITIVELY REPLACES A HEAD POSITION POINTER WITH A LAST POSITION POINTER

[75] Inventors: Harumi Hirose, Tokyo; Toshizumi Ando, Kanagawa; Yoshiki Takekawa, Tokyo; Toshiaki Isogawa; Shingo Nakata, both of Kanagawa, all of Japan

[73] Assignee: Sony Corporation, Japan

[21] Appl. No.: 746,878

[22] Filed: Nov. 18, 1996

Related U.S. Application Data

[63] Continuation of Ser. No. 803,670, Dec. 3, 1991, abandoned, which is a continuation of Ser. No. 342,084, Apr. 24, 1989, abandoned.

[30] Foreign Application Priority Data

| Apr. 28, 1988 | [JP] | Japan | 63-106298 |
| May 20, 1988 | [JP] | Japan | 63-123636 |
| May 16, 1988 | [JP] | Japan | 63-118984 |

[51] Int. Cl.$^6$ .................................... G06F 12/02
[52] U.S. Cl. ........................ 395/430; 395/421.08
[58] Field of Search ........................ 395/800, 427, 395/421.07, 421.08, 430

[56] References Cited

U.S. PATENT DOCUMENTS

| 4,064,558 | 12/1977 | Hughes | 364/900 |
| 4,638,430 | 1/1987 | Perra | 364/900 |
| 4,718,038 | 1/1988 | Yoshida | 364/900 |
| 4,783,737 | 11/1988 | Ara | 364/200 |
| 4,812,868 | 3/1989 | Utagawa | 354/402 |
| 4,814,972 | 3/1989 | Winter | 364/200 |
| 4,841,322 | 6/1989 | Kawasaki | 354/400 |
| 4,855,842 | 8/1989 | Hayes | 364/900 |
| 4,862,200 | 8/1989 | Hicks | 354/75 |
| 4,920,369 | 4/1990 | Kaneda | 354/400 |
| 4,924,253 | 5/1990 | Imai | 354/75 |
| 5,093,785 | 3/1992 | Iijima | 395/400 |

FOREIGN PATENT DOCUMENTS

2 029 147   3/1980   United Kingdom .

Primary Examiner—Eric Coleman
Attorney, Agent, or Firm—Hill, Steadman & Simpson

[57] ABSTRACT

A storage device incorporating an electrically erasable read only memory (EEPROM) or other data storage device having a limited number of total times of rewriting, has its useful like extended by the method of storing a pointer corresponding to the capacity of the memory, which pointer identifies a start position in the data storage device at which rewriting is to occur, and incrementing the pointer sequentially with each writing of the data storage device. The method and associated apparatus may be used to maintain a record of on-time of electronic apparatus, and/or to maintain data for correcting the white balance of a video camera under various light conditions.

1 Claim, 7 Drawing Sheets

SEQUENTIAL EEPROM WRITING APPARATUS WHICH SEQUENTIALLY AND REPETITIVELY REPLACES A HEAD POSITION POINTER WITH A LAST POSITION POINTER

This is a continuation of application Ser. No. 07/803, 670, filed Dec. 3, 1991 now abandoned which is a continuation of Ser. No. 07/342,084 filed Apr. 24, 1989, now abandoned.

BACKGROUND OF THE INVENTION

This invention relates to an information storage method and apparatus, and more particularly to a method and apparatus which makes possible the repeated use of a memory, in which the total number of writings is limited, for instance an EEPROM (Electrically Erasable Programmable Read Only Memory).

An electrically erasable programmable read only memory device (e.g. EEPROM) is used conventionally for data back-up during the power OFF period as a re-writable, non-volatile memory. However, it has been a disadvantage that this device has a limited number of re-writings guaranteed by the manufacturer, and so it is sometimes impractical to use that memory for data back-up during a power OFF period. For example, if 10,000 times of re-writing is guaranteed, the life time of the memory may be 3 years if it is re-written 10 times a day, and the life time may be one year if the memory is re-written 30 times a day. Therefore, an EEPROM whose guaranteed re-writing number is limited has a restricted use.

OBJECTS AND SUMMARY OF THE INVENTION

An object of this invention is to supply an information storage method and apparatus which makes it possible to increase the number of re-writings of a memory device, for example an EEPROM, more than the limit of the number guaranteed.

Another object of this invention is to supply an information storage method and apparatus which makes it possible to repeatedly use a memory whose number or re-writings is finite, by establishing a plural data area and a corresponding plural pointer area for storing pointers indicating the order of using the data. When writing to the plural data area, the order data in the pointer area are re-written, and the plural data area are used one by one in accordance with the re-written order data.

A further object of this invention is to supply an electronic apparatus which is able to write accumulated TURN ON time in a protected memory and read it from the memory during a maintenance procedure, and activate an alarm or display when the accumulated time is in excess of predetermined time. This invention thus makes it possible easily to collect data relating to endurance and life times of parts.

Another object of this invention is to provide a video camera apparatus which makes re-adjusting of the white balance unnecessary after adjusting it once, by writing the white balance data to a back-up memory, holding data for a long duration during a power OFF period, reading it from the memory when the camera is turned ON, and automatically setting the white balance.

The present invention comprises an apparatus and a method for storing information in a memory device having finite number of writings comprising an area for storing a plurality of data items in said memory device, an area for storing a plurality of pointers corresponding to said data area in said memory device to show the order of using data stored in said data area, and a control means for identifying the start position and for changing the contents of said pointer sequentially in accordance with the operation of writing data to said data area.

SUMMARY OF THE DRAWINGS

Reference will now be made to the accompany drawings, in which.

DESCRIPTION OF THE PREFERRED EMBODIMENT

Figure 1:
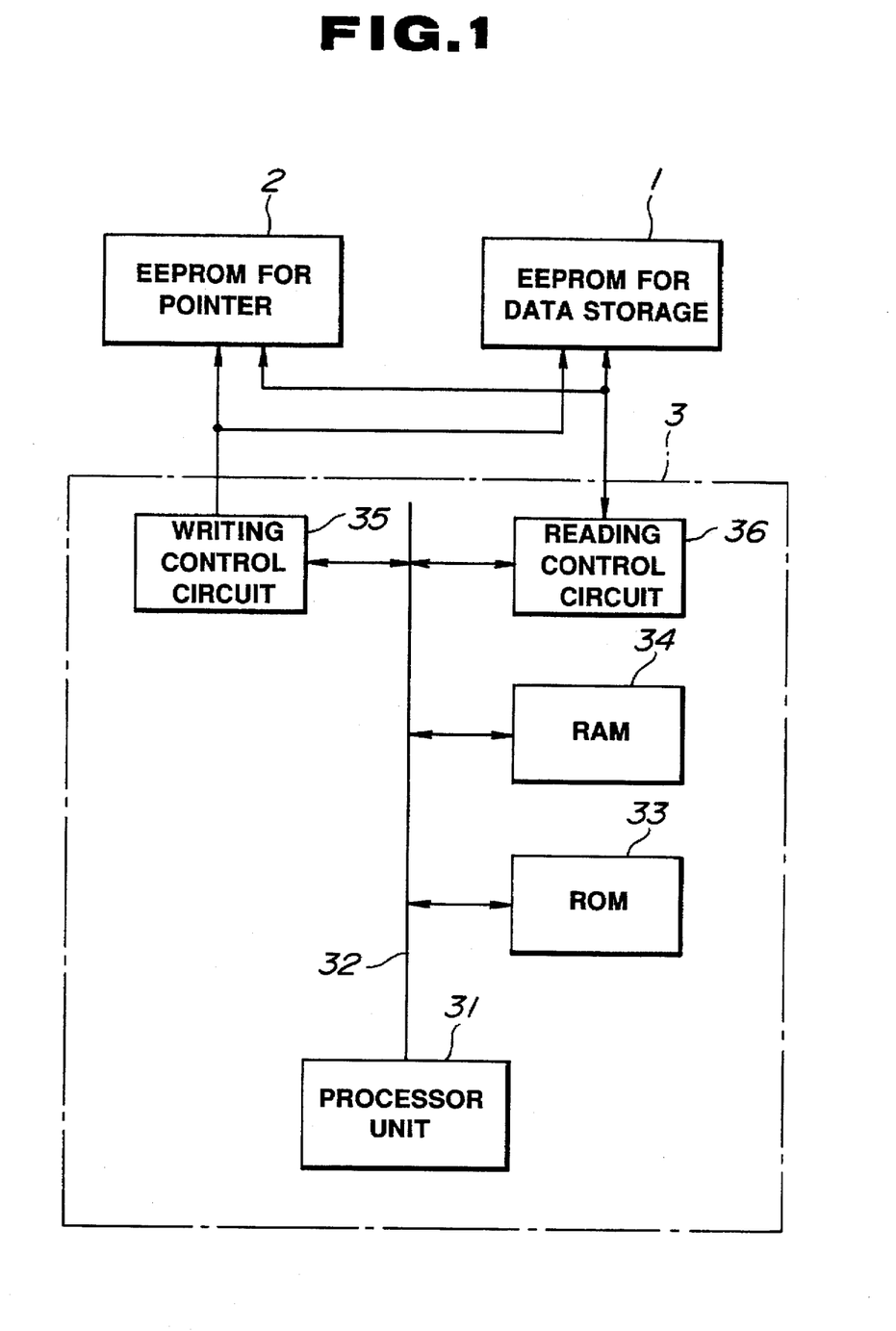
FIG. 1 is a block diagram of a first embodiment of this invention, showing information storage apparatus.

FIG. 1 is a block diagram of a first embodiment. In this embodiment, it is assumed that one byte of data is written m×n times in an EEPROM in which m times of re-writing are guaranteed. This embodiment consists of an EEPROM 1 for data storage, and EEPROM 2 for pointer storage, and a controller 3. The EEPROM 2 which has at least n bytes capacity has a pointer area of n bytes to memorize the order of using the data area. The controller 3 consists of a processor unit 31, a ROM 33, a RAM 34, a writing control circuit 35, a reading control circuit 36, each of which is connected to a bus 32 of the processor unit 31.

The write control circuit 35 performs initializing at the time of the first power ON, and writes not only the data area of the EEPROM 1, but also the pointer area of the EEPROM 2 corresponding to the data area designated by the processor unit 31 for holding the data stored during a power OFF period. The read control circuit 36 performs reading from the pointer area from the data area designated by the processor unit 31. The processor unit 31 causes the pointer area of the EEPROM 2 to store the order of using in the initializing procedure, reads the order of using through the read control circuit 36, judges the head order of using, and writes data to the data area corresponding to the pointer area through the writing control circuit 35. In this situation, the processor unit 31 replaces the head order in the pointer area with the last order. In utilizing the newest data after turning ON again, the processor unit 31 reads the order of using from the EEPROM 2 through the read control circuit 36, judges the last position, and reads data from the data area corresponding to the pointer area which holds its last order through the read control circuit 36. The program for the procedure is stored in ROM 33. The order of using or the data read from the EEPROM 1 or EEPROM 2 are transferred to the RAM 34 and utilized for judging and processing.

Figure 2:
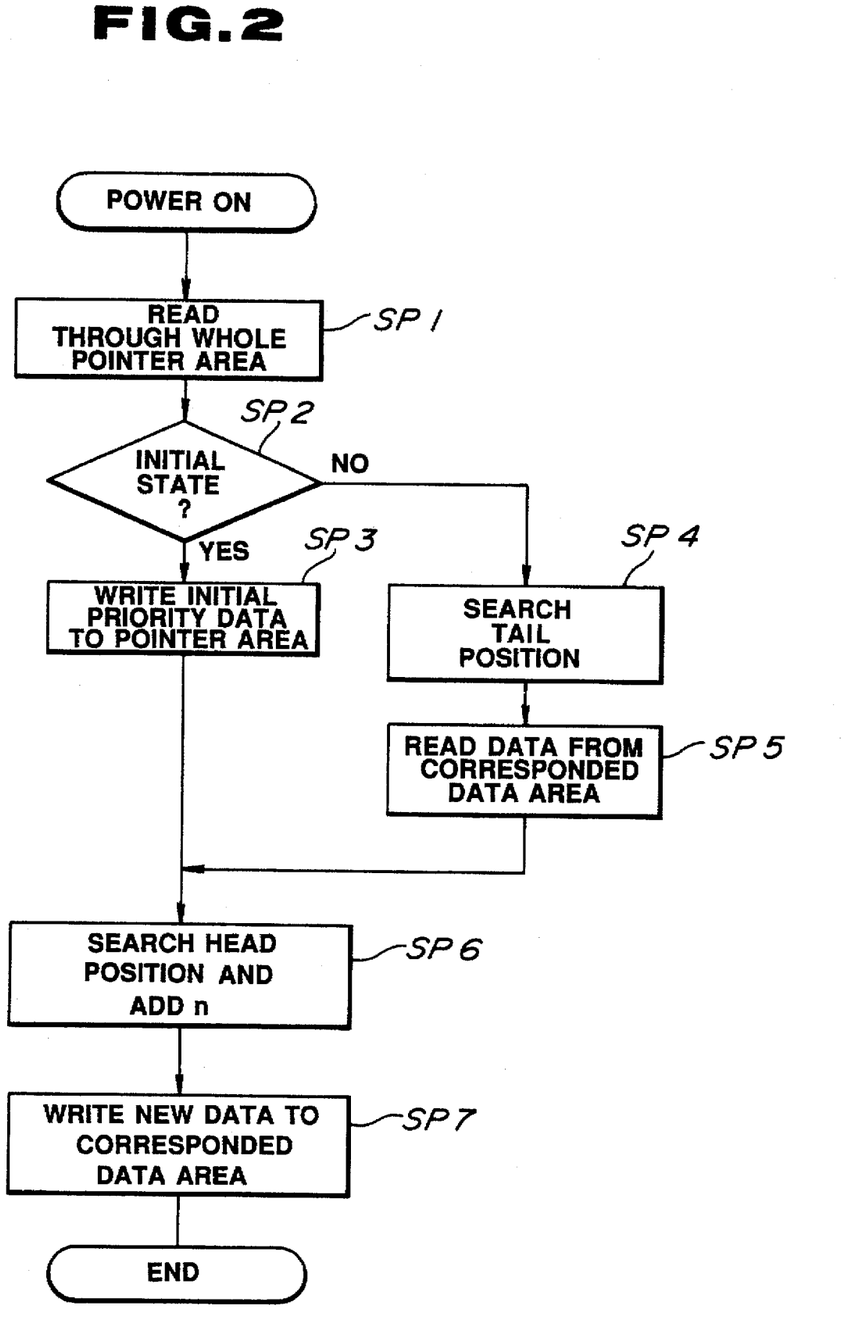
FIG. 2 is a flow chart describing an information storage method in connection with the first embodiment of this invention.

FIG. 2 is a flow chart of this embodiment. After the power is turned ON, the n bytes of data corresponding to the using order are read from the pointer area. If the data (e.g. from 0 to n−1) have not been written yet, this is recognized as the initial state of the EEPROM, and initial data (e.g. from 0 to n−1) are written to each pointer area. This process comprises the initializing process. If the contents of the data storage are full, a last position flag which shows the last position of writing is determined from the pointer data which is read, the data are read from the data storage area corresponding to the pointer data, and these data are used for general process after being transferred to the RAM, for example. This process comprises the reading procedure.

If new data to hold during power OFF appear, a head position flag which shows the first point of writing is searched from the data previously read, and the last position is marked by adding n, for example, to the head position of the pointer area, and the new data are written into the data area corresponding to this pointer area. In this way, n data items are written sequentially into the data area, the newest data being stored in the data area corresponding to the pointer area holding the last position. Thus, the head position (to be written next) can be determined from the last position, which held during the power OFF period.

The method of distinguishing the data area to be used, by the information of the using order stored in the pointer area is explained hereinafter.

Figure 3:
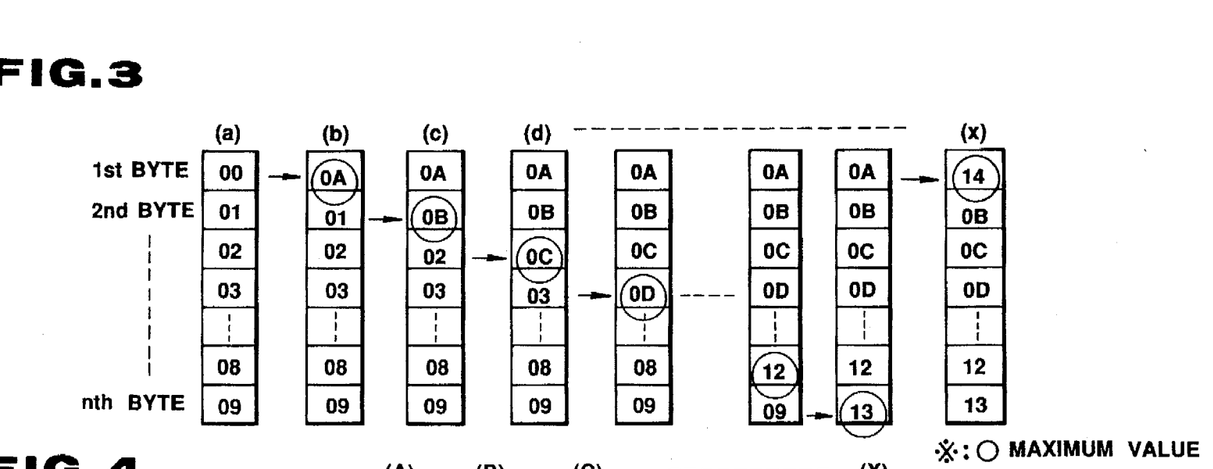
FIG. 3 and FIG. 4 are tables serving to explain the pointer area of the first embodiment.
Figure 4:
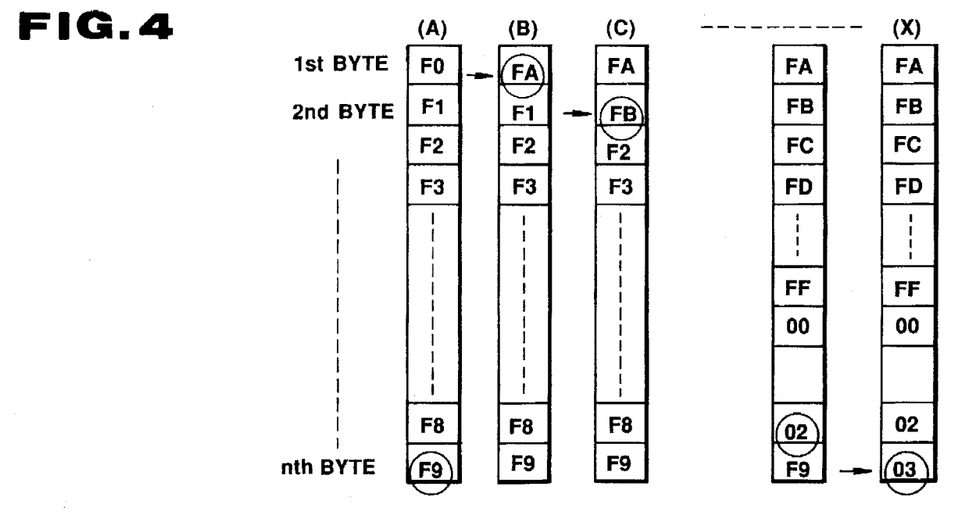

FIG. 3 and FIG. 4 explain the method of utilizing the pointer area, showing the transition of the position of the pointer area at each writing. In FIG. 3, (a) shows an initial state, (b) shows the first written state, and (c) to (x) show further state transitions sequentially achieved by writing data. It is assumed that the number of the data area n equals 10 in this explanation.

It is judged easily whether EEPROM is in a pre-initialized state (probably the whole data are FF or OO in hexadecimal notation) or not, by whether the contents of the read pointer EEPROM is sequentially filled with consecutive numbers or not. As shown in FIG. 3(a) a series which enables to distinguish using positions (e.g. 00, 01, 02, . . . , 09 (equal to n−1) are written from first byte to last byte in turn. In FIG. 3(a), 00 shows the head position, and 09 shows the last position. Therefore, the maximum value shows the last position, and the minimum value shows the head position of the next use. As shown in FIG. 3(b), the first data to be re-written next is written on the data area corresponding to the pointer of 00, and this pointer data is replaced by OA by adding n (=10) to the number of the pointer to indicate that this pointer area has been used and to mark it as the last position. Thus, the position number of the data area that has been used shows always the maximum value, which indicates that the newest data is stored in this data area. Writing of data is performed sequentially from the minimum value of the pointer. Therefore, the contents of the EEPROM pointer storage changes as (b)→(c)→(d)_>. . . →(x) in FIG. 3. By adding n to the stored pointer as a marking every time a data area is used, "00" is included in the using order when the result of adding overflows "FF" (zero cross), as shown in FIG. 4(x). On this occasion, the data from F1 to FF are ignored, and the maximum value is regarded as the last position (OO) showing the newest data, while the minimum value in the sereis F1 . . . FF is regarded as the head position for the next re-writing the pointer area. The area which is next to the last position can also be regarded as the head position. In this embodiment, it is assumed that one data area is constituted by one byte but it can also be constituted by plural bytes or a given number of bits as one word. This invention is not restricted to the use of EEPROMs, but equally applies to other memory devices whose total number over-writings are limited. Simple decreasing series are also available for the series which shows the using order, in addition to various simple increasing series.

In the above-mentioned embodiment, EEPROMs for the pointer and the data are separate but they can be set in one EEPROM.

The information storage method and apparatus of the first embodiment of this invention have the following advantages.

1. The limit of using a memory device which has finite number of re-writing is multiplied n times by establishing n data areas and pointer areas.

2. Thus, the usage of a memory device which has finite number of re-writings can be expanded.

3. Damage to the memory device (e.g. the EEPROM) is decreased, because each portion of the data area is not written continuously.

The second embodiment of this invention is explained hereinafter as an application to an electronic apparatus.

Figure 5:
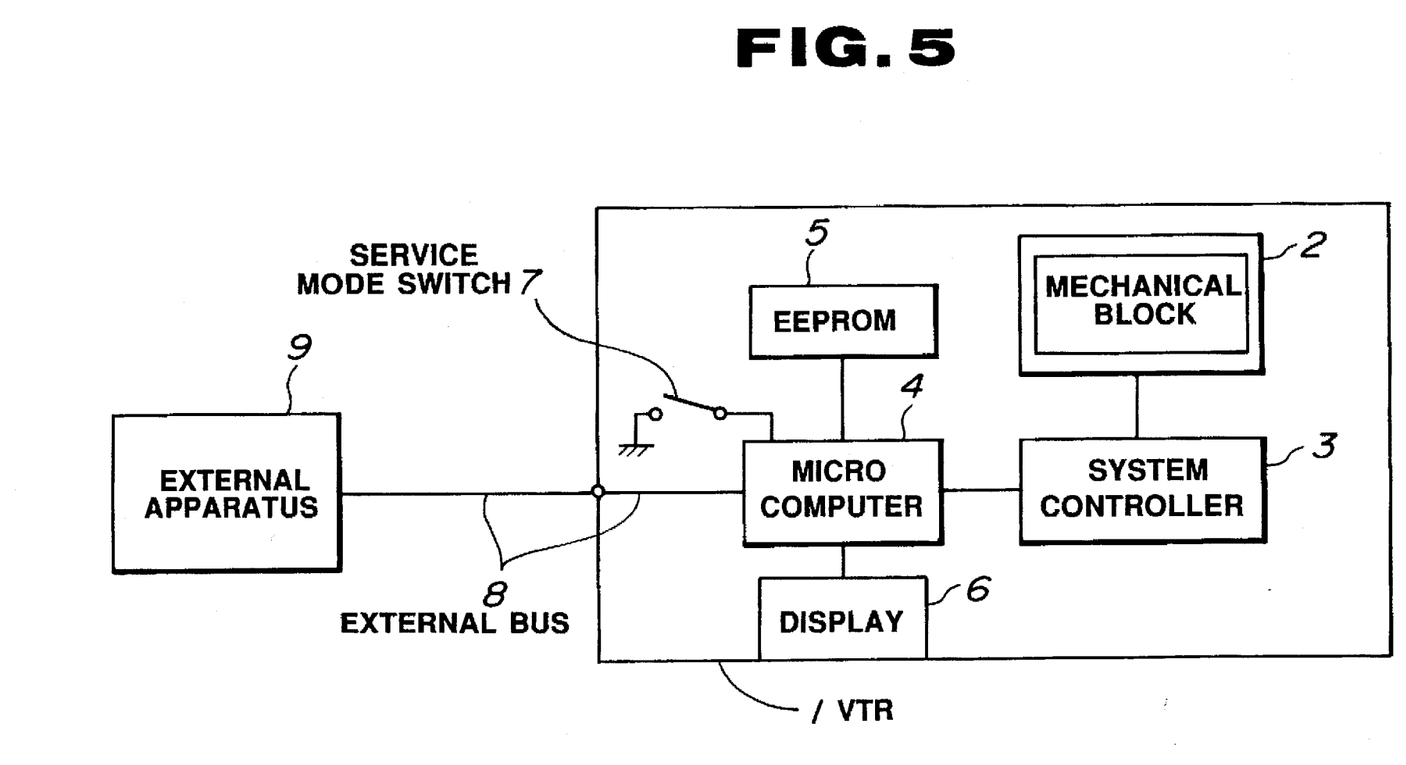
FIG. 5 is a block diagram of a second embodiment of this invention.

FIG. 5 is a block diagram of this embodiment especially for VTR apparatus. This apparatus consists of a VTR 1, a mechanical block 2, a system controller 3 for the mechanical block 2, a micro computer 4 which gives control instructions to the system controller 3 to control the total system, an EEPROM 5 which is accessed by the micro computer 4 and holds data even during the power OFF period (programmable read-only-memory of the electrically erasable type), a display 6 which displays various signs and characters, under the direction of the micro computer 4, a service mode switch 7 which controls the service mode of the micro computer 4 during maintenance operations, such as checking or repairing, an external bus 8 of the micro computer 4, and external apparatus 9 which is connected to the external bus 8 during checking or repairing.

Figure 6:
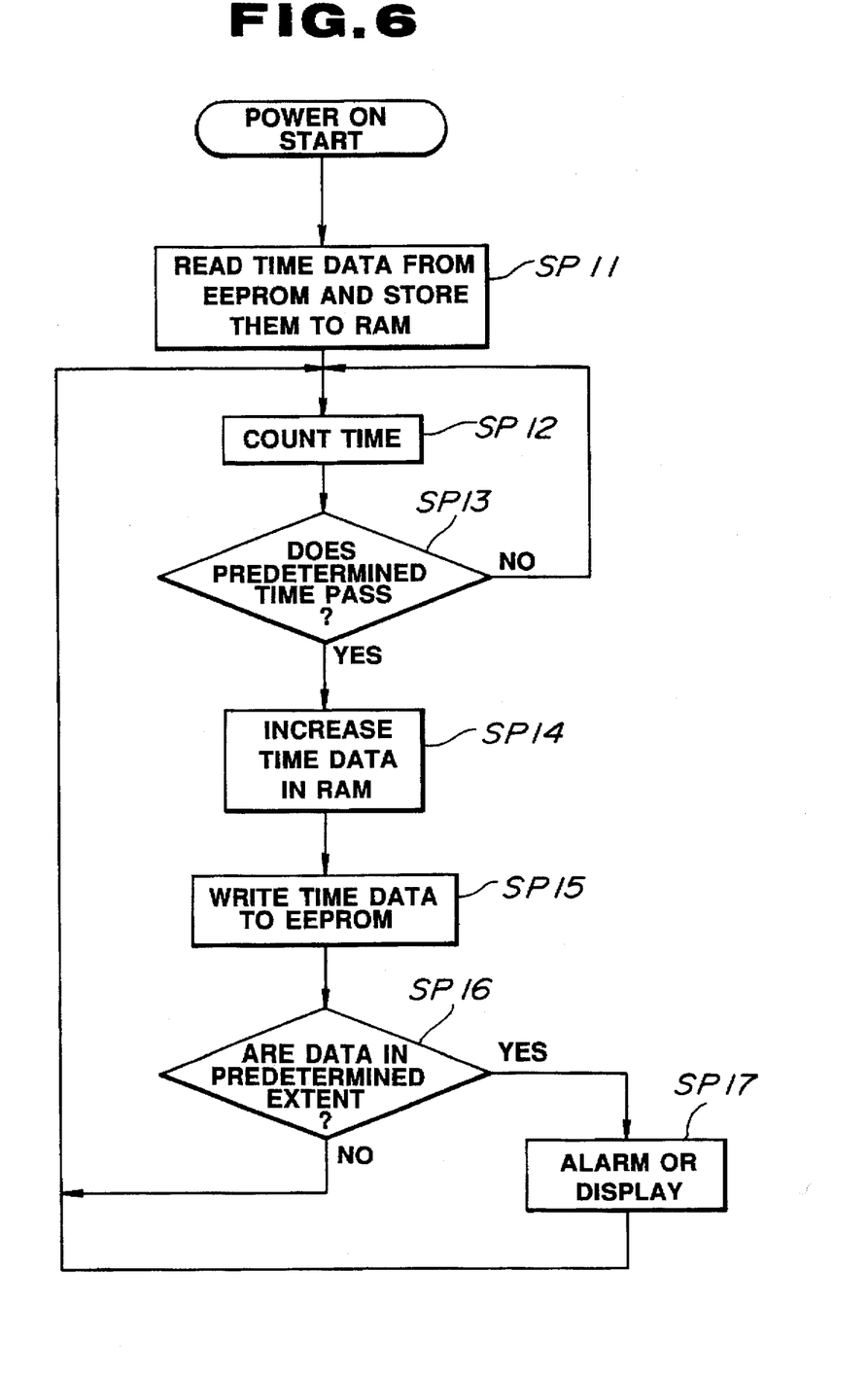
FIG. 6 is a flow chart describing operation of the second embodiment of this invention.

FIG. 6 is a flow chart of this embodiment. In this embodiment, time of use data peculiar to each apparatus are written to an EEPROM 5 located in an electronic apparatus (e.g. VTR 1), and are read during a service mode.

First, when a micro computer 4 in FIG. 5 starts with the power ON, it reads time data stored in an EEPROM 5 (initial value is zero), and stores it in a RAM within the micro computer 4. Next, the micro computer 4 counts up the power-on-time, and increases the value of the time data stored in the RAM every predetermined period (e.g. 10 minutes or 1 hour). The new (increased) data are re-written to the EEPROM 5 every such period. It is possible to write data to the EEPROM 5 within a power-holding time just prior to power OFF time, to decrease the number of writings. The micro computer 4 checks whether the time data stored in the RAM are within a predetermined range or beyond it, and if this condition is achieved, self-diagnosis can be performed by making an alarm sound or an alarm display. These alarms inform a user of the need for repair or exchange before the apparatus gets out of order. In repairing, a service person selects a service mode for the micro computer 4 by turning the service mode switch 7 on. The micro computer 4 reads written data in the EEPROM 5, and informs the service person of the time data, i.e., the accumulated turn-on-time of the VTR, by displaying it on the display 6, or reading the data sent through the external bus 8, to external apparatus. Alternatively, the micro computer 4 can get mode information of the VTR 1 from a system controller 3, and then count the total time of operation of a particular mode (e.g. recording or reproducing mode), and write to the EEPROM at predetermined intervals, to calculate and store the accumulated time of the special mode. These data can be reset to zero during operation in the service mode, by operating switches or receiving an external command from the external bus 8, etc. (that is, zero is written in the EEPROM). Thus, the data can be cleared to zero when a head is exchanged at a service center, and the time of use information for the new head can be monitored. For the memory device, not only an EEPROM but a battery backed up RAM and other holdable memory devices may also be used. The alarm is optional. The electronic apparatus using the memory device explained in the first embodiment gives the following advantages. Because the life of the information storage apparatus of this invention is longer than previously employed EEPROMs, this embodiment is able to count accumulated time for a longer time without failure. A measurement of the accumulated working time offers information of timing useful for the exchanging or re-adjusting of each part in the apparatus. So it is necessary that the life or accumulated working time measurement means is longer than the life of all other parts of the apparatus, so that the accumulated working time measurement is available upon the occurrence of failure of any part. An extension of life is achieved effectively by using this invention.

The third embodiment of this invention, applied to a video camera, is explained hereinafter.

Figure 7:
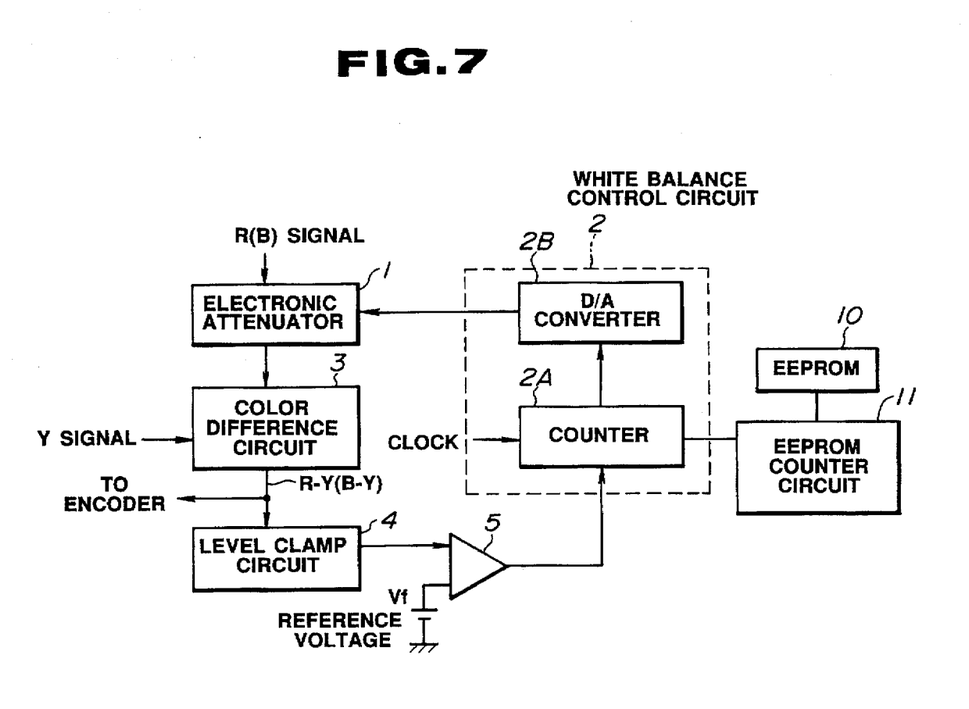
FIG. 7 As a block diagram of a third embodiment of this invention.

FIG. 7 is a block diagram of this embodiment in the white balance system of a video camera.

Although FIG. 7 shows only a circuit for adjusting the color balance of the R signal, and memorizing it, there also exists another circuit for adjusting and memorizing the B signal color balance in a practical unit. As a result, the R and B levels are matched to the G level of the camera. It comprises an electronic attenuator 1 controlled by the output signal of a white balance control circuit 2, which attenuates the R signal; a color difference circuit 3 which generates a color difference signal R-Y from the R signal attenuated by the electronic attenuator 1 and the luminance Y signal. The color difference signal R-Y is supplied to an encoder (not shown), and to a level clamp circuit 4 to make a loop to the white balance control circuit 2. The level clamp circuit 4 fixes a black level of the R signal by fixing the color difference signal to a predetermined DC level. The comparator 5 compares the output of the level clamp circuit 4 with a reference voltage Vf corresponding to a G signal level, and judges whether the level of R signal is larger than the G signal level or not. The output of the comparator 5 is connected to the white balance control circuit 2. The white balance control circuit 2 consists of a counter 2A which changes the color balance and finally memorizes the white balance data, and a D/A converter 2B which converts the counted value in the counter 2A from digital to analog form and supplies a control voltage to the electronic attenuator 1. The counter 2A changes the counter value by up-counting or down-counting of the clock in accordance with the output of the comparator 5, and stops counting when the output signal of the comparator shows that both input voltages of the comparator have become equal, and memorizes the counted value as the white balance data. The EEPROM control circuit 11 writes the white balance data, which are counted values of two counters 2A for R and B signals, to the EEPROM 10 when white balance is completely adjusted, that is, when the levels of R and B signals are adjusted to be equal to the level of the G signal. When the power of the apparatus is turned on, the EEPROM control circuit 11 reads the white balance data from the EEPROM 10, and sets the stored data into the counter 2A.

This embodiment makes it possible to extend the life of the information storage means using an EEPROM to several years or several tens of years, by storing white balance data in the memory device explained in the first embodiment. Although a video camera has been turned OFF for a long period, when it is turned ON, the last white balance data stored in the EEPROM are set to the counter 2A to revive the last white balance condition.

Figure 8:
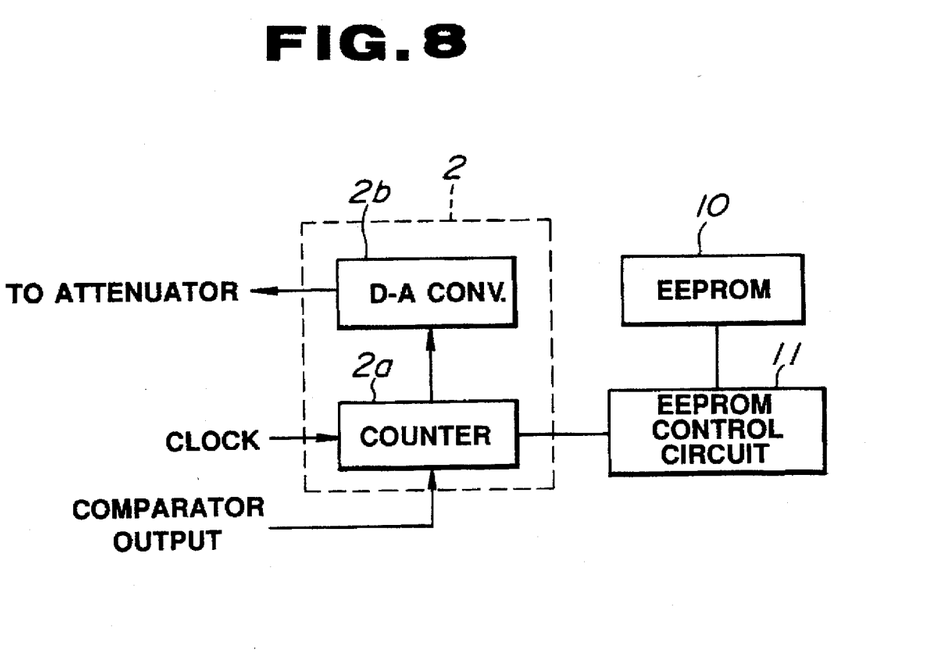
FIG. 8 and FIG. 9 are partial block diagrams of the third embodiment of this invention.
Figure 9:
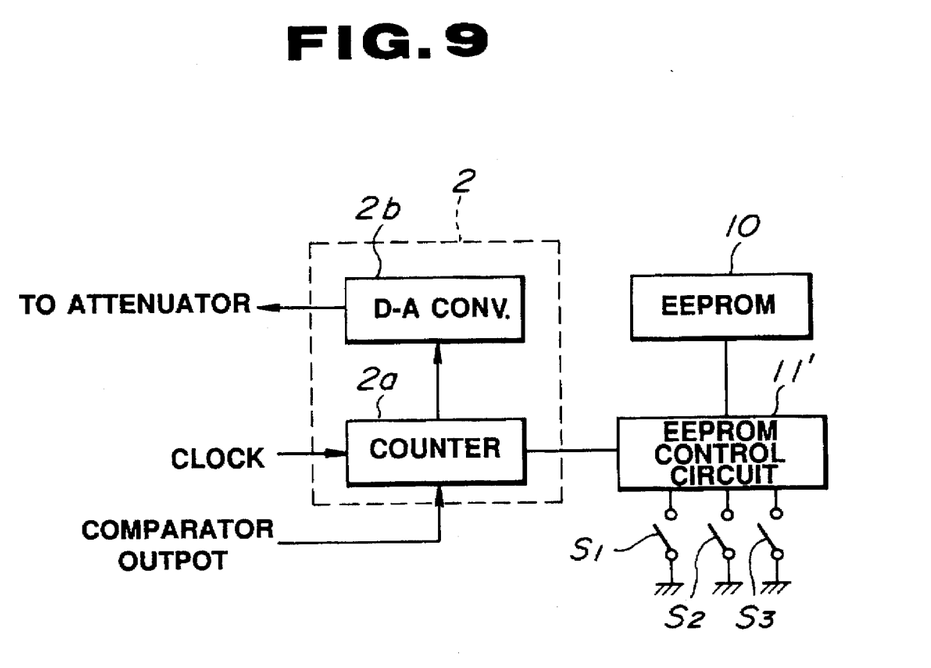

FIG. 8 illustrates a significant part of the embodiment of FIG. 7, for a single white balance setting. FIG. 9 shows the same significant part of a block diagram of another embodiment, capable of accommodating a plurality of white balance settings for different light conditions.

The procedure of adjusting the white balance is generally performed by shooting a white subject, so the white balance data are affected by the character of the light source which is used. The embodiment of FIG. 9 enables the holding of a plurality of white balance data, and setting the white balance data in accordance with several kinds of light sources. This embodiment consists of basically the same elements as FIG. 8, but the EEPROM 10 in FIG. 9 has capacity enough to hold a plurality of white balance data sets, and the EEPROM control circuit 11' has switches S1, S2, and S3 to designate a given set of the data. This construction enables the writing data to the EEPROM 10 whose address are designated by the switches, and to read white balance data from the EEPROM 10 whose addresses are designated by the switches. For example, a white balance data which is suitable for normal indoor light is stored in the EEPROM 10 by selecting the switch S1, data which is suitable for special studio light is stored by selecting the switch S2, and data which is suitable for outdoor light is stored by selecting the switch S3. These white balance data are read by designating which of the switches S1 to S3 is selected to set the data into the counter 2A, and the suitable white balance is revised in the same manner as FIG. 7. The switches S1 to S3 may be arranged so that only one of them can be selected at a time, and it is possible that white balance data are set from EEPROM 10 to the counter 2A by selecting one of the switches at the moment of turning on, and the data are reset again by detecting a change of the switches during power-on period.

In this embodiment, plural white balance data are held during the power-off period. A suitable memory for this embodiment is not only an EEPROM but also a battery backed-up RAM and other types of memory devices, which can hold data during the power off time. As mentioned above, the video camera apparatus using this invention writes the white balance into the information storage means of this invention which holds the store data thus written during the power off period. Therefore, it is possible to hold data longer than using merely a conventional EEPROM. Once the white balance is adjusted correctly, it is not necessary to adjust it again.

It will be understood that variations and modifications may be effected without departing from the spirit and scope of the novel concepts of the present invention.

What is claimed is:

1. An apparatus for storing data in memory device having a finite total number of writings comprising:

a data memory having a plurality of data areas for storing data;

a pointer memory for storing pointer information corresponding to said plurality of data areas, said pointer information identifying a beginning data area and wherein said pointer information is sequentially ordered from a head position pointer to a last position pointer; and a control means for identifying a start in said pointer memory by said head position pointer and writing and changing the contents of said pointer memory sequentially and repetitively by replacing said head position pointer with a last position pointer.

* * * * *